(12) United States Patent
Ogimoto (10) Patent No.: US 8,750,028 B2
(45) Date of Patent: Jun. 10, 2014

(54) MAGNETIC MEMORY ELEMENT AND DRIVING METHOD FOR SAME

(75) Inventor: Yasushi Ogimoto, Higashiyamato (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 354 days.

(21) Appl. No.: 13/148,093

(22) PCT Filed: May 14, 2010

(86) PCT No.: PCT/JP2010/058165
§ 371 (c)(1),
(2), (4) Date: Feb. 16, 2012

(87) PCT Pub. No.: WO2011/001746
PCT Pub. Date: Jan. 6, 2011

(65) Prior Publication Data
US 2012/0134201 A1    May 31, 2012

(30) Foreign Application Priority Data
Jul. 3, 2009    (JP) ................................ 2009-159106

(51) Int. Cl.
*G11C 11/00*    (2006.01)

(52) U.S. Cl.
USPC ........................... 365/158; 365/148; 365/171

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 428/810–816, 817–825.1, 826; 438/3; 977/933–935
See application file for complete search history.

(56) References Cited

U.S. PATENT DOCUMENTS 7,615,771 B2*   11/2009   Fontana et al. .................... 257/5
2007/0253243 A1*   11/2007   Fontana et al. ............... 365/171

FOREIGN PATENT DOCUMENTS

| JP | 2002-261352 A | 9/2002 |
|---|---|---|
| JP | 2007-150265 A | 6/2007 |
| JP | 2008-028362 A | 2/2008 |
| JP | 2009-081215 A | 4/2009 |
| WO | WO-03/025946 A1 | 3/2003 |
| WO | WO-03/043017 A2 | 5/2003 |
| WO | WO-2005/079348 A2 | 9/2005 |

OTHER PUBLICATIONS

D.D. Djayaprawira et al, "230% room-temperature magnetoresistance in CoFeB/MgO/CoFeB magnetic tunnel junctions", Applied Physics Letters, vol. 86, 092502, 2005.

(Continued)

*Primary Examiner* — Harry W Byrne
(74) *Attorney, Agent, or Firm* — Rabin & Berdo, P.C.

(57) ABSTRACT

A magnetic memory element and a method of driving such an element are disclosed. The magnetic memory element has a magnetic tunnel junction portion with a spin-valve structure having a perpendicular magnetization free layer formed of a perpendicular magnetization film, a perpendicular magnetization pinned layer formed of a perpendicular magnetization film, and a nonmagnetic layer sandwiched between the perpendicular magnetization free layer and the perpendicular magnetization pinned layer, and records information by application of an electric pulse to the magnetic tunnel junction portion. An in-plane magnetization film, interposed in the path of the electric pulse, is disposed in the magnetic tunnel junction portion. The in-plane magnetization film is configured so as to exhibit antiferromagnetic (low-temperature)-ferromagnetic (high-temperature) phase transitions depending on temperature changes based on application of the electric pulse to the magnetic tunnel junction portion.

11 Claims, 9 Drawing Sheets

(56) References Cited

OTHER PUBLICATIONS

J. Hayakawa et al, "Current-induced magnetization switching in MgO barrier based magnetic tunnel junctions with CoFeB/Ru/CoFeB synthetic ferromagnetic free layer", Japanese Journal of Applied Physics, vol. 45, No. 40, pp. L1057-L1060, 2006.

* cited by examiner

MAGNETIC MEMORY ELEMENT AND DRIVING METHOD FOR SAME

TECHNICAL FIELD

This invention relates to a magnetic memory element capable of storing information by electrical means, and a driving method for such an element.

BACKGROUND ART

In recent years there have been striking increases in the capacity of nonvolatile semiconductor storage devices, of which flash memory is representative, and products with capacities as great as 32 Gbytes have been announced. In particular, the product value of USB memory and storage for mobile phones is increasing. That is, nonvolatile semiconductor storage devices are inherently superior, in areas which are uniquely the realm of solid state element memory, such as resistance to vibration, high reliability, and low power consumption, and so are becoming the mainstream of storage devices for portable music and video content, and as storage for transportable electronic equipment.

On the other hand, separately from the above storage, energetic research is being conducted to impart nonvolatile properties to DRAM currently used as main memory in information equipment, toward the realization of a so-called "instant-on computer" which starts instantaneously upon use and reduces power consumption during standby to infinitesimal levels. In order to realize such computers, it is thought that the technical specifications to be satisfied by DRAM are (1) a switching time of under 50 ns, and (2) overwrite cycles exceeding $10^{16}$; in addition, the memory must be provided with nonvolatile properties.

As candidates for such next-generation nonvolatile semiconductor storage devices, research and development are being conducted on ferroelectric memory (FeRAM), magnetic memory (MRAM), phase-change memory (PRAM), and other nonvolatile memory elements based on various principles. Among these, MRAM is viewed as a promising candidate to satisfy the above technical requirements to replace DRAM. The number of overwrite cycles ($>10^{16}$) cited in the above technical requirements is the numerical value assumed based on the number of accesses resulting from continuous accessing every 30 ns for 10 years. When the memory is nonvolatile, a refresh cycle is not necessary, and so there are cases in which this number of cycles is not necessary. Although MRAM is at the prototype level, already $10^{12}$ or more overwrite cycles have been achieved, and as switching times are also fast (<10 ns), feasibility is regarded as high compared with other technologies which are candidates for nonvolatile semiconductor storage devices.

Problems with this MRAM are a large cell area, and high accompanying bit cost. Currently commercialized low-capacity (approximately 4 Mbits) MRAMs are current-induced magnetic field overwrite type devices. If the cell area is from 20 to 30 $F^2$ (where F is the minimum feature size of the manufacturing process) or larger, because of the excessive size, such devices are not practical as a replacement technology for DRAM. On the other hand, two breakthrough technologies are changing the situation. One is magnetic tunnel junction (MTJ) devices using MgO tunnel insulating films, by which means a magnetoresistance of 200% or more can easily be obtained (see for example Non-patent Reference 1). The other is a current-induced magnetization switching (STT) method. The STT method is a technology which can avoid the problem, critical in current-induced magnetic field overwrite type devices, that the magnetic reversal field in minute cells increases; that is, this technology enables lowering of the write energy with scaling. By means of this STT method, a one transistor-one MTJ configuration theoretically becomes possible, and so cell areas of 6 to 8 $F^2$, comparable to DRAM, are anticipated (see for example Non-patent Reference 2).

The STT method is a method in which the magnetization of the free layer is reversed by the current polarity. In order for the magnetization to be parallel in the free layer and in the pinned layer, a current is passed from the free-layer side, that is, spin-polarized electrons are injected into the free layer from the pinned-layer side via a nonmagnetic layer. Conversely, to make the magnetization antiparallel, a current is passed from the pinned-layer side. That is, spin-polarized electrons are injected from the free-layer side into the pinned-layer side via the nonmagnetic layer. At this time, only electrons having spin parallel to the pinned layer are passed; electrons with spin not parallel to the pinned layer are reflected, and accumulate in the free layer. As a result, the magnetization of the free layer is thought to be disposed antiparallel to the pinned layer. That is, in this method electrons are injected so as to conserve angular momentum, including localized spin.

In the above STT method, during integration at levels of 1 Gbit or higher, the current density during switching must be lowered to 0.5 MA/$cm^2$, and so various measures have been taken. For example, a structure has been disclosed in which a magnetic layer having an easy axis of magnetization perpendicular to the magnetization of the free layer is provided above the free layer with a nonmagnetic metal layer intervening (see Patent Reference 1). The aim is to lower the current density necessary for switching by injecting a spin current perpendicular to the magnetization of this free layer into the free layer. In particular, an MTJ using a perpendicular magnetization film can be expected to offer the advantages of (1) reduced current density and (2) reduced cell area compared with an element using an in-plane magnetization film, and so use of the above method in an MTJ employing a perpendicular magnetization film is thought to be promising.

Further, a structure has also been disclosed in a magnetic phase transition layer capable of magnetic phase transitions, that is, transitions from antiferromagnetism to ferromagnetism, and from ferromagnetism to antiferromagnetism, is formed directly on a free layer, and the two layers are exchange-coupled. The aim is, by causing magnetic coupling of the two layers, to reduce the magnetization during switching, and reduce the current density during switching, through changes in the magnetization of the magnetic phase transition layer from perpendicular magnetization to in-plane magnetization (see Patent Reference 2).

Patent Reference 1: Japanese Patent Application Laid-open No. 2008-28362

Patent Reference 2: Japanese Patent Application Laid-open No. 2009-81215

Non-patent Reference 1: D. D. Djayaprawira et al, "230% room-temperature magnetoresistance in CoFeB/MgO/CoFeB magnetic tunnel junctions", Applied Physics Letters, Vol. 86, 092502, 2005

Non-patent Reference 2: J. Hayakawa et al, "Current-induced magnetization switching in MgO barrier based magnetic tunnel junctions with CoFeB/Ru/CoFeB synthetic ferromagnetic free layer", Japanese Journal of Applied Physics, Vol. 45, L1057-L1060, 2006

However, in the structure first cited (Patent Reference 1), although lowering of the current density during switching can be expected, there is instead the problem that reliability as a nonvolatile memory element is worsened. That is, during readout also the magnetic field leaking from the magnetic layer provided on the free layer acts on the magnetization in the free layer which is storing information, so that the problem of readout disturbance arises, and there is the problem that retention characteristics are degraded.

Further, in the second structure cited (Patent Reference 2), there is the problem that the switching characteristics depend on the magnetic coupling between the magnetic phase transition layer and the free layer, that is, on the quality of the abovementioned exchange coupling. That is, depending on the state of coupling, there are concerns that problems of variation in switching characteristics may occur.

DISCLOSURE OF THE INVENTION

This invention was devised in light of the above problems, and has as an object the provision of a magnetic memory element and a driving method for such an element to enable reduction of the current density during switching, without detracting from readout durability, retention characteristics, or other aspects of reliability.

As a result of examination of the above problems, the inventor of this application arrived at the magnetic memory element and driving method described below.

That is, a magnetic memory element of this invention has a magnetic tunnel junction portion with a spin-valve structure having a free layer formed of a perpendicular magnetization film, a pinned layer formed of a perpendicular magnetization film, and a nonmagnetic layer sandwiched between the free layer and the pinned layer, and records information by application of an electric pulse to the magnetic tunnel junction portion; and is characterized in that an in-plane magnetization film, interposed in the path of the electric pulse, is disposed in the magnetic tunnel junction portion and the in-plane magnetization film is configured so as to exhibit antiferromagnetic (low-temperature)-ferromagnetic (high-temperature) phase transitions depending on temperature changes based on application of the electric pulse to the magnetic tunnel junction portion.

Further, a magnetic memory element driving method of this invention is a method of driving a magnetic memory element having a magnetic tunnel junction portion with a spin-valve structure having a free layer formed of a perpendicular magnetization film, a pinned layer formed of a perpendicular magnetization film, and a nonmagnetic layer sandwiched between the free layer and the pinned layer, and is characterized in having a step of providing, in the magnetic tunnel junction portion, an in-plane magnetization film which exhibits antiferromagnetic (low-temperature)-ferromagnetic (high-temperature) phase transitions according to temperature; a step, during information record/erase, of applying an electric pulse of polarity suitable for information record/erase to the magnetic tunnel junction portion via the in-plane magnetization film, to cause the temperature of the in-plane magnetization film to be equal to or higher than the transition temperature; and a step, during information readout, of applying an electric pulse of polarity suitable for information readout to the magnetic tunnel junction portion via the in-plane magnetization film, to cause the temperature of the in-plane magnetization film to be equal to or less than the transition temperature.

By means of the above configuration, the current density during switching can be reduced, and a leakage magnetic field from the phase transition in-plane magnetization film does not occur in the readout or retention states, so that high reliability can be secured.

Here, a spin-valve structure is a structure comprising a magnetic layer (pinned layer)/nonmagnetic layer/magnetic layer (free layer). The magnetization disposition of the pinned layer is configured so as to be more difficult to reverse, for example by current-induced magnetization switching, than the magnetization disposition of the free layer. In order to make the magnetization disposition of the pinned layer difficult to reverse, a method can be employed in which an antiferromagnetic layer is provided so as to be in proximity to the pinned layer, and through an exchange-coupled interaction between the magnetizations of the pinned layer and of the antiferromagnetic layer, the effective coercive force of the pinned layer is increased. As a separate mode, the layer thickness of the pinned layer can be made sufficiently thick that the magnetization is not easily changed, and the magnetic properties of the pinned layer may be made different from those of the free layer. In either case, readout of information can utilize the phenomenon in which the resistance value changes corresponding to the combination of magnetizations when there is a relative change in the angle made by the magnetization of the free layer with the magnetization of the pinned layer, that is, the phenomenon in which the resistance value is lowest when the magnetization of the free layer and the magnetization of the pinned layer are disposed to be parallel (parallel disposition), and the resistance value is highest when the magnetization of the free layer and the magnetization of the pinned layer are disposed to be antiparallel (antiparallel disposition).

The nonmagnetic layer serves to cut off the magnetic coupling between magnetic layers (between the pinned layer and the free layer). When a metal is used, the device operates as a giant magnetoresistive (GMR) element, and when an insulator is used, the device operates as a tunneling magnetoresistive (TMR) element. However, when switching is performed using current, the pinned layer does not necessarily have to have a high coercive force (Hc) or magnetic anisotropy (Ku). It is important that the magnetization (Ms) be sufficiently large, and that spin precession movement not occur readily.

By means of a magnetic memory element and driving method for such an element of this invention, the current density during switching can be reduced, without detracting from readout durability, retention characteristics, or other aspects of reliability.

DETAILED DESCRIPTION

Below, embodiments of a magnetic memory element and driving method for such an element of the invention are explained based on the drawings.

Figure 1:
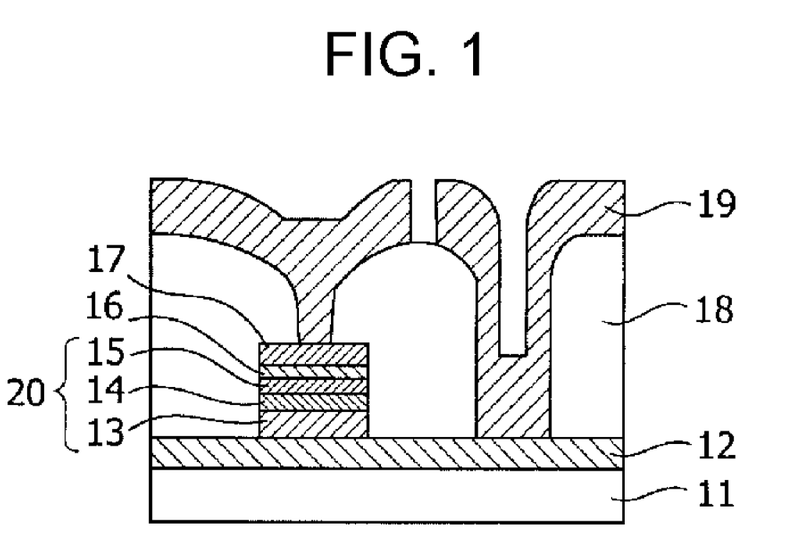
FIG. 1 is a cross-sectional view showing the configuration of the magnetic memory element of an embodiment of the invention.

FIG. 1 is a cross-sectional view of a TMR (tunneling magnetoresistive) element used in a magnetic memory element of the invention. When manufacturing this TMR element, a sputtering method is used to form, in order on a substrate 11, a lower electrode 12, perpendicular magnetization pinned layer 13 comprising a perpendicular magnetization film, tunneling insulating film as a nonmagnetic layer 14, and perpendicular magnetization free layer 15 comprising a perpendicular magnetization film. Thereupon are formed a nonmagnetic metal layer 16 having a film thickness of 2 nm or less, and a phase transition in-plane magnetization film 17 having a film thickness of 20 nm.

In this embodiment, the lower electrode 12 is formed of Cu/Ta, the perpendicular magnetization pinned layer 13 is formed of FePt, the nonmagnetic layer 14 is formed of MgO, the perpendicular magnetization free layer 15 is formed of FePt/CoFe, the nonmagnetic metal layer 16 is formed of Cu, and the phase transition in-plane magnetization film 17 is formed of FeRh.

When using FePt as the material of the perpendicular magnetization pinned layer 13 and perpendicular magnetization free layer 15 and using FeRh as the material of the phase transition in-plane magnetization film 17, it is preferable that the film deposition temperature be set to 350 to 500° C. Further, after collectively manufacturing the multilayered film, a crystallization process may be employed by RTA (Rapid Thermal Annealing) using a lamp or laser.

Next, Ar ion milling or another method is used to machine the magnetic multilayer film manufactured in this way to the junction size of 200×100 nm, and then an interlayer insulating film 18 (SiO$_2$) is formed. Then, with the magnetic tunnel junction portion 20 comprising the element 13 to 15 and the lower electrode 12 intervening, an upper electrode 19 (Cu/Ta) is formed. In this embodiment, as explained above, FePt having giant magnetic anisotropy (Ku) is used as the material of the perpendicular magnetization pinned layer 13; the reason for this is as follows. This is because, when FePt is used as the perpendicular magnetization pinned layer 13, the perpendicular magnetization of pinned layer 13 is not reversed by an in-plane component spin flow from the phase transition in-plane magnetization film 17. Further, in this embodiment a two-layer structure, FePt/CoFe, is used as the perpendicular magnetization of free layer 15; the reason for this is as follows. This is because in FePt, the energy required for magnetization reversal is large, but in CoFe, the energy required for magnetization reversal is small. Hence rather than forming the perpendicular magnetization free layer 15 from FePt alone, formation with CoFe added to the FePt causes the perpendicular magnetization of the free layer 15 to be reversed easily.

As the nonmagnetic metal layer 16, it is desirable that a material with a small lattice mismatch with the FeRh (2.986 Å), FePt (3.7 Å), MgO (4.2 Å), used as materials in the above elements, be used. Specifically, it is preferable that Ag (4.086 Å) or Al (4.049 Å), which can be disposed parallel to FePt, MgO and similar with in-plane lattices, or Cr (2.884 Å) and similar, which can be disposed inclined at 45° similarly to FeRh, be used. By using these materials, satisfactory lattice constant relations are obtained, so that magnetic multilayer films having satisfactory crystallinity can be manufactured.

As explained above, the perpendicular magnetization free layer 15 is formed as a perpendicular magnetization film. By means of this perpendicular magnetization free layer 15, stable switching is possible without imparting a shape anisotropy, so that the element area can be made isotropic (specifically, with a circular or square shape). This is advantageous with respect to improving integration.

Figure 2A:
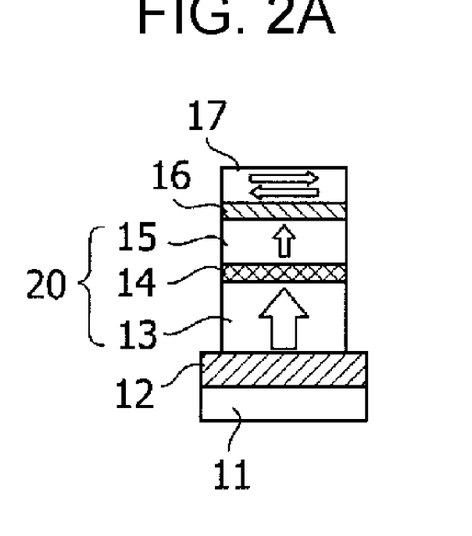
FIG. 2 is a schematic diagram showing the magnetization of the phase transition in-plane magnetization film (antiferromagnetic in FIG. 2(a) and ferromagnetic in FIG. 2(b)) during readout operation (FIG. 2(a)) and record/erase operation (FIG. 2(b)) of the magnetic memory element of an embodiment of the invention.
Figure 2B:
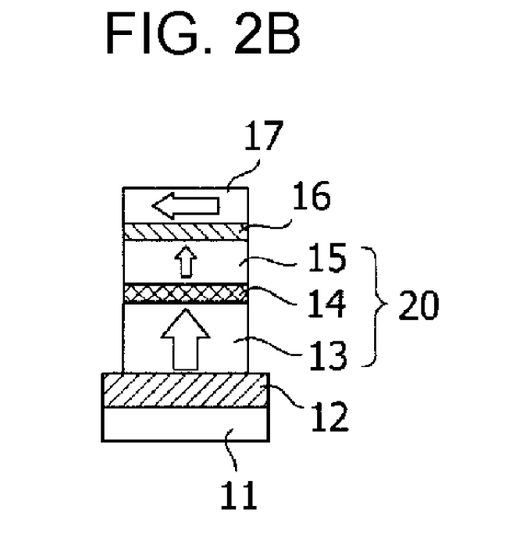

A magnetic memory element of this embodiment of the invention is configured using the above TMR element. FIG. 2(a) is a schematic diagram showing the type of magnetization (antiferromagnetism) of the phase transition in-plane magnetization film 17 during readout operation of this magnetic memory element, and FIG. 2(b) is a schematic diagram showing the type of magnetization (ferromagnetism) of the phase transition in-plane magnetization film 17 during record/erase operation of this magnetic memory element. When not in operation or during readout operation, the temperature of the phase transition in-plane magnetization film 17, positioned above the MTJ 20 having a spin-valve structure, is equal to or less than the Néel temperature ($T_N$) of the phase transition in-plane magnetization film 17. Hence the phase transition in-plane magnetization film 17 becomes an antiferromagnetic phase, and a leakage magnetic field does not occur. On the other hand, during record/erase an electric pulse is applied to the minute magnetic tunnel junction portion 20, and this is accompanied by a rise in the temperature of the phase transition in-plane magnetization film 17. The temperature of the phase transition in-plane magnetization film 17 generally rises to 100° C. or higher. By making the $T_N$ of the phase transition in-plane magnetization film 17 equal to or lower than the temperature reached during record/erase, a ferromagnetic phase is made to appear in the film 17. At this time, because in this embodiment a magnetic material with an easy axis of magnetization in the film plane is used as the phase transition in-plane magnetization film 17, a spin current with an in-plane component is injected into the perpendicular magnetization free layer 15 by the current accompanying an electric pulse during record/erase, and as a result there is the advantageous effect that magnetization reversal (switching) in the perpendicular magnetization free layer 15 becomes easy.

Figure 3A:
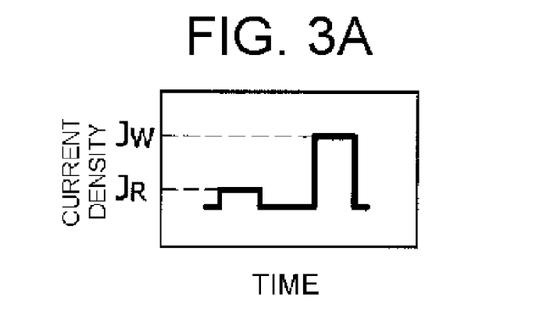
FIG. 3(a) is a graph showing the current density ($J_R$, $J_W$) of electric pulses used in readout and write/erase operations.
Figure 3B:
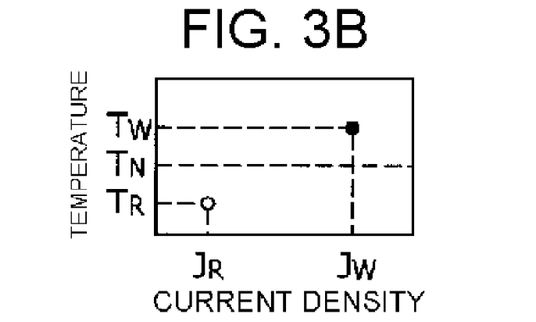
FIG. 3(b) is a graph showing the temperature ($T_R$, $T_W$) of the phase transition in-plane magnetization film 17 when electric pulses are applied at the current densities $J_R$. $J_W$, and the Néel temperature ($T_N$) of the phase transition in-plane magnetization film 17.
Figure 3C:
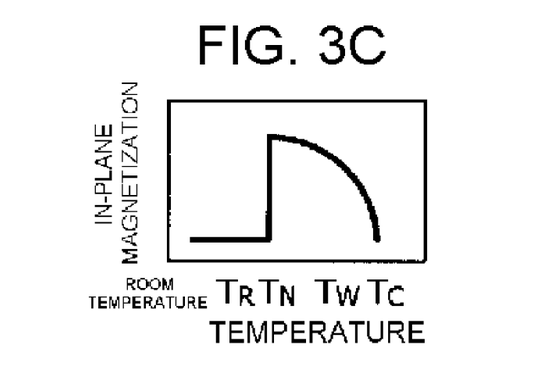
FIG. 3(c) is a graph showing the temperature dependence of magnetization in the phase transition in-plane magnetization film 17.

FIG. 3(a) is a graph showing the current density ($J_R$, $J_W$) of electric pulses used in readout operations and record/erase operations. FIG. 3(b) is a graph showing the temperatures ($T_R$, $T_W$) of the phase transition in-plane magnetization film 17 when electric pulses at current densities $J_R$, $J_W$ are applied, and the Néel temperature ($T_N$) of the phase transition in-plane magnetization film 17. And FIG. 3(c) is a graph showing the temperature dependence of magnetization in the phase transition in-plane magnetization film 17.

As shown in FIG. 3(a), a small value (for example 50 µA) is used for the current density $J_R$ during readout, and a large value (for example 500 µA) is used for the current density $J_W$ during record/erase. As indicated in FIG. 3(b), the temperature of the magnetic tunnel junction portion 20 at this time changes from $T_R$ to $T_W$, crossing $T_N$. And as shown in FIG. 3(c), the magnetization if the in-plane magnetization film in the phase transition in-plane magnetization film 17 depends on the temperature T. When $T=T_R$ is established, an antiferromagnetic phase is exhibited, and when $T=T_W$ is established, a ferromagnetic phase is exhibited. From this, the phase transition in-plane magnetization film 17 formed above the magnetic tunnel junction portion 20 having a spin-valve structure as shown in FIG. 2 is an antiferromagnetic phase during readout, and is a ferromagnetic phase during record/erase.

Figure 4A:
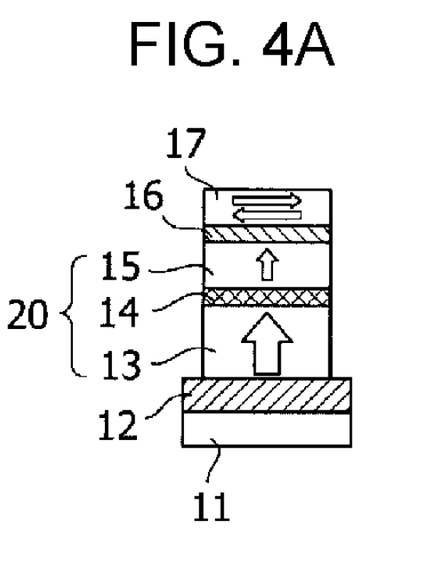
FIG. 4(a) is a schematic diagram showing the structure of the magnetic memory element of an embodiment of the invention when the phase transition in-plane magnetization film is provided above the free layer.
Figure 4B:
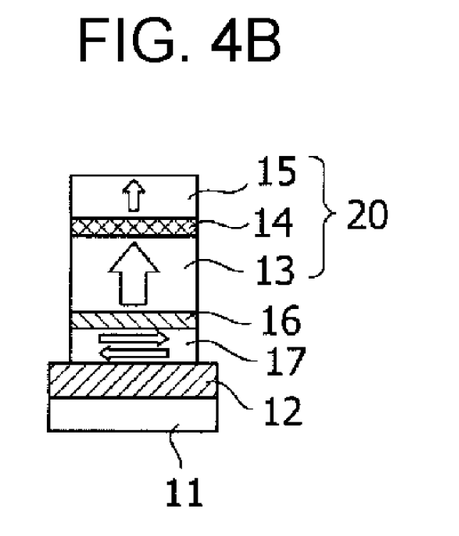
FIG. 4(b) is a schematic diagram showing the structure of the magnetic memory element of an embodiment of the invention when the phase transition in-plane magnetization film is provided below the pinned layer.

As shown in FIG. 4, in addition to the structure in which the phase transition in-plane magnetization film 17 is formed above the perpendicular magnetization free layer 15 (FIG. 4(a)), the phase transition in-plane magnetization film 17 may be formed below the perpendicular magnetization pinned layer 13 with the nonmagnetic metal layer 16 interposed (FIG. 4(b)). This is because a spin current having an in-plane component, injected from the phase transition in-plane magnetization film 17, can pass through the perpendicular magnetization pinned layer 13 and act on the perpendicular magnetization free layer 15. At this time, the perpendicular magnetization pinned layer 13 must be designed so as not to be reversed. Reversal of the perpendicular magnetization pinned layer 13 can be avoided by using such well-known methods as making the film thickness of this layer 13 sufficiently large and selecting a material with a large magnetic anisotropy (Ku) as the material for the layer 13.

Figure 5A:
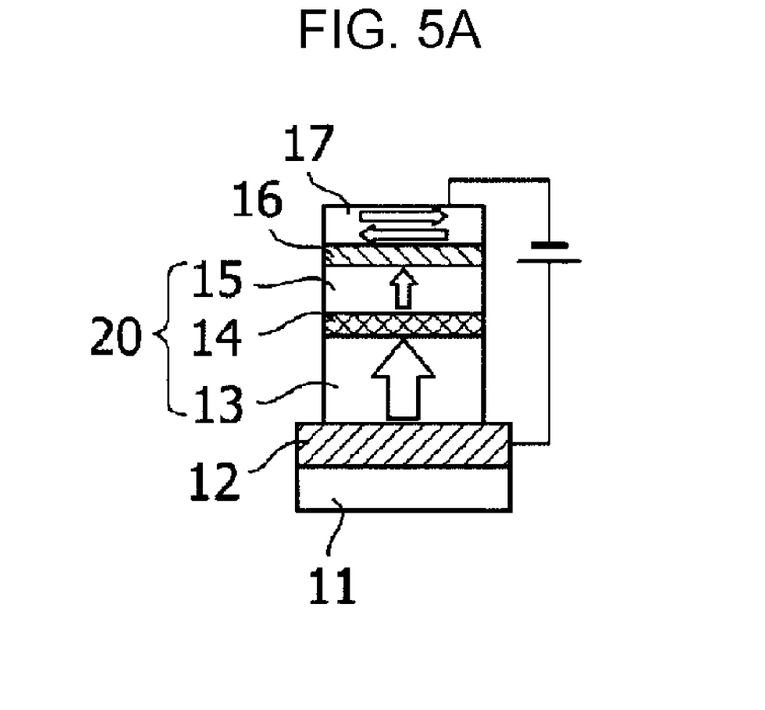
FIG. 5 is a schematic diagram showing a process of switching from a parallel disposition to an antiparallel disposition of the magnetic memory element of an embodiment of the invention.
Figure 5B:
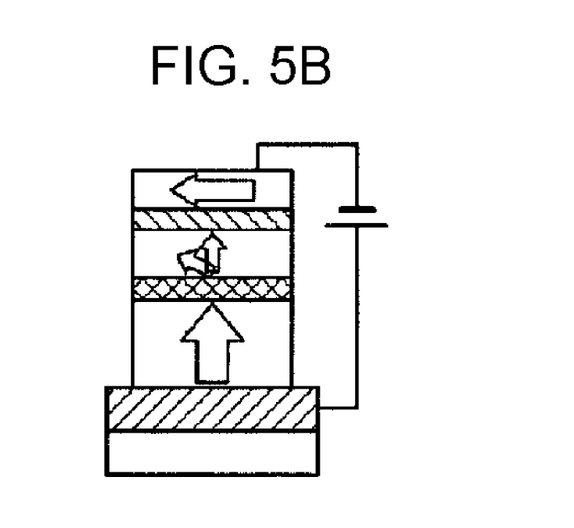
Figure 5C:
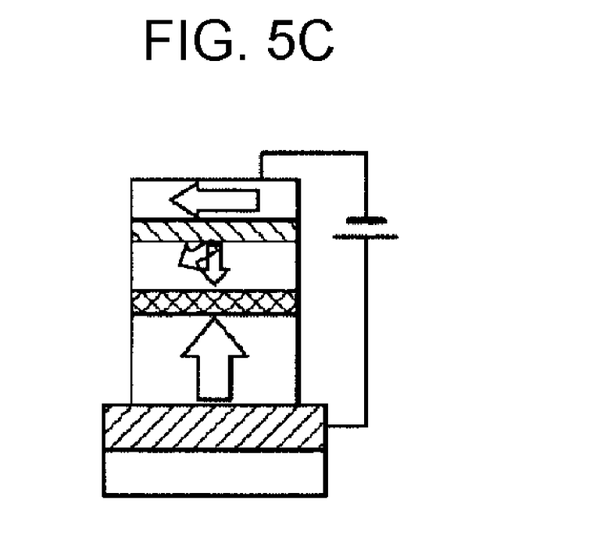
Figure 5D:
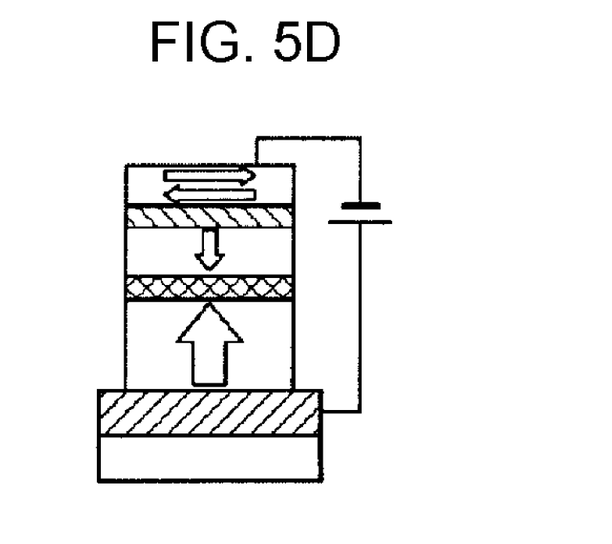
Figure 6A:
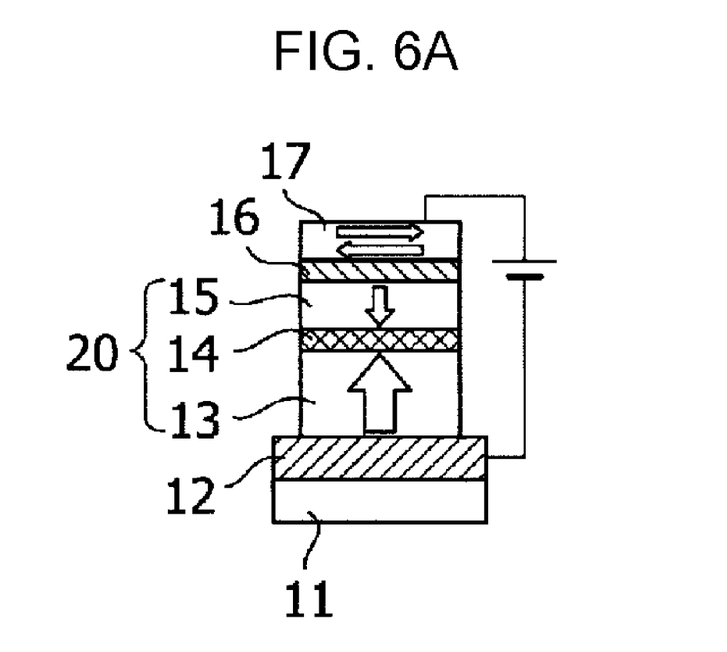
FIG. 6 is a schematic diagram showing a process of switching from an antiparallel disposition to a parallel disposition of the magnetic memory element of an embodiment of the invention.
Figure 6B:
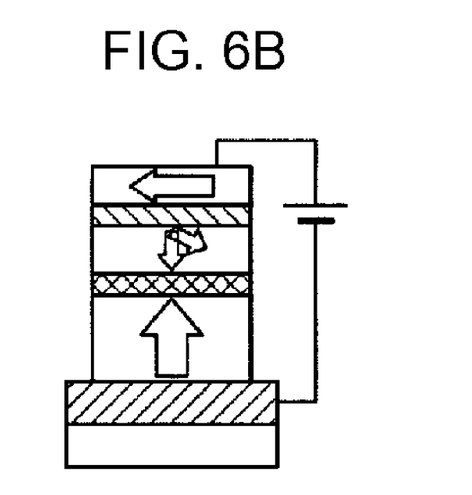
Figure 6C:
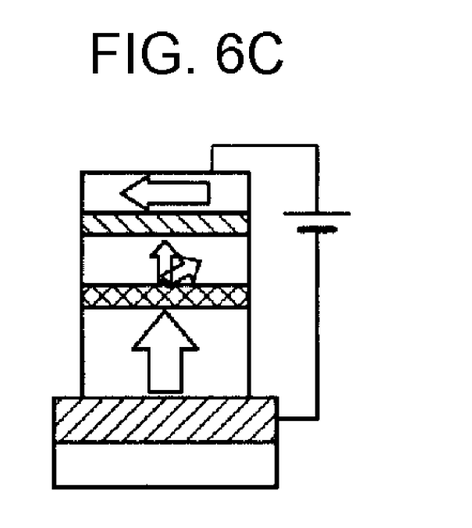
Figure 6D:
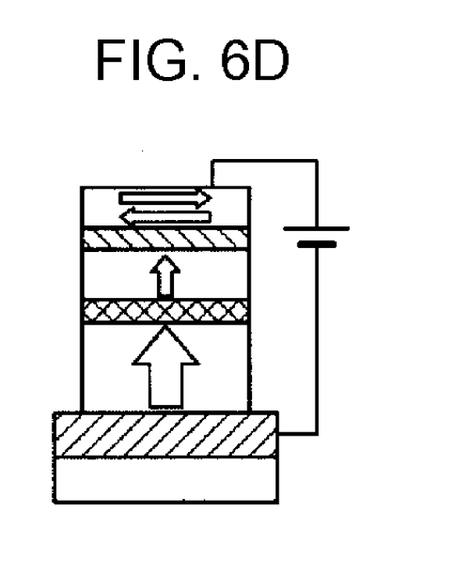

Next, the switching which occurs when an in-plane component spin current in the phase transition in-plane magnetization film 17 is injected into the perpendicular magnetization film of the free layer 15 in the magnetic tunnel junction portion 20 is explained. FIG. 5 is a schematic diagram showing the process of switching from the parallel disposition to the antiparallel disposition in the configuration of FIG. 4(a). In FIG. 4, electrons are disposed so as to flow downward from above the magnetic tunnel junction portion 20. FIG. 5(a) shows the initial state. In this initial state, the phase transition magnetization film 17 is an antiferromagnetic phase, and so a leakage magnetic field is not generated. FIG. 5(b) is a schematic diagram of when an electric pulse $J_W$ corresponding to a record/erase operation is applied. At this time, the temperature of the phase transition in-plane magnetization film 17 rises, and the phase transition in-plane magnetization film 17 becomes a ferromagnetic phase, so that in-plane magnetization occurs. By this means, a spin flow with an in-plane component is injected into the perpendicular magnetization free layer 15, and the perpendicular magnetization of the free layer 15 is inclined, and reversal or precession movement is induced. As a result, the perpendicular-direction component is reversed (FIG. 5(c)). After application of the electric pulse, the temperature of the phase transition in-plane magnetization film 17 falls to $T_N$ or lower, so that the in-plane component of the spin flow vanishes, and reversal of the perpendicular magnetization of the free layer 15 is completed (FIG. 5(d)).

FIG. 6 is a schematic diagram showing a process of switching from the antiparallel disposition to the parallel disposition. Here the current polarity is reversed, so that electrons flow upward from below the magnetic tunnel junction portion 20. FIG. 6(a) shows the initial state. A difference with the switching from the parallel disposition to the antiparallel disposition shown in FIG. 5 is that electrons flow from the side of the perpendicular magnetization pinned layer 13, so that the in-plane component spin flow acting on the perpendicular magnetization free layer 15 is first reflected by the phase transition in-plane magnetization film 17, and has an in-plane component in the direction opposite the direction of magnetization of the phase transition in-plane magnetization film 17. However, the ease of reversal and precession movement does not depend on the direction of the in-plane component. Hence similarly to the case of FIG. 5, the perpendicular magnetization of the free layer 15 is inclined, and reversal or precession movement is induced (FIG. 6(b)), and by this means the perpendicular-direction component is reversed (FIG. 6(c)), and after electric pulse application the reversal of perpendicular magnetization of the free layer 15 is completed (FIG. 6(d)).

As the in-plane magnetization film of the phase transition in-plane magnetization film 17 which exhibits such antiferromagnetic-ferromagnetic phase transitions, a FeRh alloy is useful. FeRh undergoes antiferromagnetic-ferromagnetic phase transitions at the Néel temperature $T_N$ at or above room temperature (approximately 70° C.), and has a high Curie temperature of approximately 400° C. Further, FeRh has the bcc (Body-Centered Cubic) structure, and film with excellent crystallinity can be manufactured using processes at 350 to 500° C. Hence a thin film exhibiting excellent magnetic characteristics can be manufactured as the phase transition in-plane magnetization film 17 on a FePt, CoFe or similar perpendicular magnetization free layer 15 having the bcc structure, with for example a nonmagnetic metal layer 16 of Cr having the same bcc structure, or of Al, Ag or similar which have the fcc (Face-Centered Cubic) structure but have small lattice mismatch, intervening. As already explained, the lattice constant of FeRh is 2.986 Å, and the lattice constant of MgO is 4.2 Å. When the FeRh lattice is rotated 45° within the plane the lattice constant is 4.2 Å, and lattice matching is good. A phase transition in-plane magnetization film 17 comprising this FeRh is easily grown on MgO, or on a perpendicular magnetization free layer 15 with the bcc structure epitaxially grown on MgO.

Figure 7:
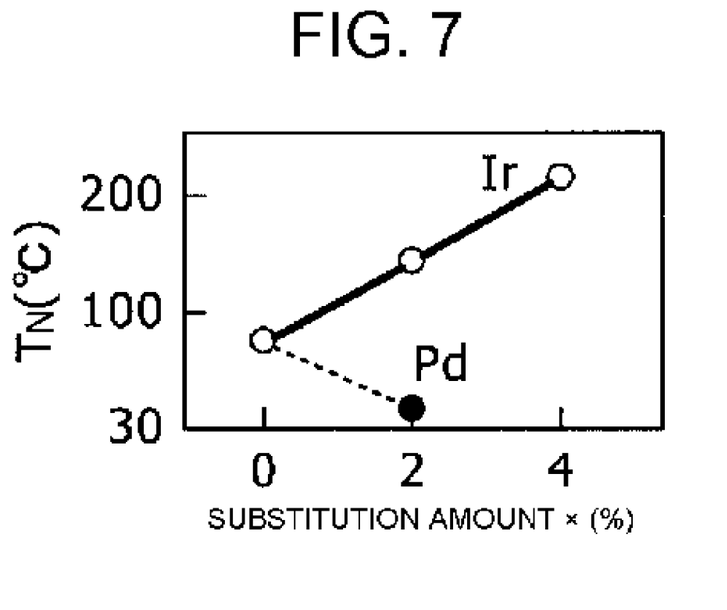
FIG. 7 is a graph showing the change in $T_N$ due to substitution of Ir and Pd in a FeRh film used as the phase transition in-plane magnetization film of the magnetic memory element of an embodiment of the invention.

Further, by substituting (adding) Ir in the FeRh which is the material of the phase transition in-plane magnetization film 17, the $T_N$ can be adjusted up to 200° C. As shown in FIG. 7, the increase in $T_N$ with substitution amount x is substantially linear. Addition of 2% Ir can increase the $T_N$ to 130° C., and addition of 4% can increase the $T_N$ to 200° C. However, if the $T_N$ is increased too much, the value of the electric pulse necessary for phase transition becomes too great, one should pay attention to this matter. It is preferable that $T_N$ be in the range 80 to 100° C. On the other hand, $T_N$ is reduced by addition of Pd or Pt. For example, as shown in FIG. 7, upon addition of 2% Pd the value of $T_N$ is lowered to approximately 30° C. In this case, a leakage magnetic field occurs to some degree depending on the usage temperature. However, because $T_N$ is low, depending on the required specifications of the device, it may be possible to further reduce the current density. In this way, by substitution (addition) of Ir, Pd, Pt and similar, $T_N$ can be adjusted, a fact which is highly useful in operating temperature design of a device. For example, when ensuring operation between −30 and 80° C., by setting $T_N$ to 80° C., the phase transition in-plane magnetization film 17 becomes the antiferromagnetic phase, so that disturbance during readout and degradation of retention characteristics can be prevented. Further, it is known that at a FeRh film thickness of 20 nm, the antiferromagnetic-ferromagnetic phase transition is sharp, and so it is preferable that the film thickness of the perpendicular magnetization free layer 15 be made 20 nm or greater. By this means, the margin for readout operation and record/erase operation can be broadened.

In the above, operation was explained based on the configuration shown in FIG. 4(a); but operation similar to the above operation results for the configuration shown in FIG. 4(b) as well, and so an explanation of this operation is omitted.

In a magnetic memory element with the above configuration, a phase transition in-plane magnetization film 17 is provided, so that the reversal current density necessary for switching can be reduced by approximately 50% at the maximum in the case of switching from parallel to antiparallel, and by approximately 30% at the maximum in the case of switching from antiparallel to parallel, and the switching time can be shortened by approximately 50%.

Further, because in the above configuration the Néel temperature $T_N$ is substantially 80° C., during readout there is no leakage magnetic field from the phase transition in-plane magnetization film 17. Hence there is no disturbance during readout, and there is no degradation at all of retention characteristics between room temperature (27° C.) and 80° C.

During record/erase shown in FIG. 5(b), the phase transition in-plane magnetization film 17 becomes the ferromagnetic phase, so that in-plane magnetization occurs. At this time, due to the magnetostatic coupling with the perpendicular magnetization free layer 15, the magnetization is inclined from within the plane to the perpendicular direction. In this case similarly, it is confirmed that the reversal current density can be reduced. Depending on the magnetization angle, the reversal current density can be still further reduced.

As described above, in a magnetic memory element and method of driving such an element of this invention, by providing a phase transition in-plane magnetization film, a magnetic tunnel junction portion 20 can be realized with reduced current density necessary for switching, without detracting from readout durability, retention characteristics, or other aspects of reliability. The materials, compositions, and methods of formation of the configurations exemplified in these embodiments are not limited to those described above. For example, the composition ratio of the FeRh which is the material of the phase transition in-plane magnetization film 17 need not necessarily be Fe:Rh=1:1, and utilizing the property by which the $T_N$ is higher for larger amounts of Rh, and by adding Ir or Pd, Pt, the $T_N$ may be adjusted appropriately. It is preferable that Rh be in the range 40 to 60%, and Ir or Pd, Pt be in the range 1 to 4%, by which means $T_N$ can be set to the upper limit of the element usage temperature (approximately 80° C.) Further, an example was presented in which FePt was used as the perpendicular magnetization films of the perpendicular magnetization pinned layer 13 and perpendicular magnetization free layer 15; in addition, TbFeCo, GdCo and other amorphous rare earth transition metals, Co/Ni multilayer films, and various other materials can be used appropriately. In particular, even when the above amorphous materials or crystals with poor lattice matching are used in the perpendicular magnetization free layer 15, by using a material capable of lattice matching with FeRh in the nonmagnetic metal layer 16, FeRh with satisfactory crystallinity can be obtained. This is because the nonmagnetic metal layer 16 acts as a buffer layer for the FeRh, and defects which are unavoidable when forming the FeRh on an amorphous layer or a layer with poor lattice matching can be absorbed within the nonmagnetic metal layer 16.

The invention claimed is:

1. A magnetic memory element, comprising:
    a magnetic tunnel junction portion having a spin-valve structure, the spin-valve structure having
    a free layer formed of a perpendicular magnetization film;
    a pinned layer formed of a perpendicular magnetization film; and
    a nonmagnetic layer disposed between the free layer and the pinned layer, which is configured to record information by application of an electric pulse to the magnetic tunnel junction portion; and
    an in-plane magnetization film that is disposed in the magnetic tunnel junction portion and is interposed in a path of the electric pulse;
    wherein the in-plane magnetization film is configured to transition between an antiferromagnetic phase and a ferromagnetic phase based on a temperature change; and
    wherein the temperature change is based on an application of the electric pulse to the magnetic tunnel junction portion.

2. The magnetic memory element according to claim 1, wherein a nonmagnetic metal layer is disposed on the magnetic tunnel junction portion, between the magnetic tunnel junction portion and the in-plane magnetization film.

3. The magnetic memory element according to claim 1, wherein the in-plane magnetization film is disposed on the side of the free layer.

4. The magnetic memory element according to claim 1, wherein the in-plane magnetization film is disposed on the side of the pinned layer.

5. The magnetic memory element according to claim 1, wherein the in-plane magnetization film comprises a FeRh alloy.

6. The magnetic memory element according to claim 5, wherein the FeRh alloy forming the in-plane magnetization film includes at least one element from among Ir, Pd, and Pt.

7. The magnetic memory element according to claim 5, wherein the film thickness of the in-plane magnetization film is 20 nm or greater.

8. A driving method for a magnetic memory element, comprising:
    providing a magnetic tunnel junction portion with a spin-valve structure having a free layer formed of a perpendicular magnetization film, a pinned layer formed of a perpendicular magnetization film, and a nonmagnetic layer disposed between the free layer and the pinned layer;
    providing an in-plane magnetization film in the magnetic tunnel junction portion;
    selectively varying the in-plane magnetization film between an antiferromagnetic low-temperature phase and a ferromagnetic high-temperature phase based on a temperature change;
    applying an electric pulse of polarity for information record/erase to the magnetic tunnel junction portion via the in-plane magnetization film, during information record/erase, to cause the temperature of the in-plane magnetization film to be equal to or higher than a transition temperature; and
    applying an electric pulse of polarity for information readout to the magnetic tunnel junction portion via the in-plane magnetization film, during information readout, to cause the temperature of the in-plane magnetization film to be equal to or less than the transition temperature.

9. The magnetic memory element according to claim 1, wherein the antiferromagnetic phase is a low-temperature phase.

10. The magnetic memory element according to claim 1, wherein the ferromagnetic phase is a high-temperature phase.

11. A driving method for a magnetic memory element, comprising:

providing a magnetic tunnel junction portion with a spin-valve structure;
providing an in-plane magnetization film in the magnetic tunnel junction portion;
selectively varying the in-plane magnetization film between an antiferromagnetic phase and a ferromagnetic phase based on a temperature change;
applying an electric pulse to the magnetic tunnel junction portion via the in-plane magnetization film, during information record/erase, to cause the temperature of the in-plane magnetization film to be equal to or higher than a transition temperature; and
applying an electric pulse to the magnetic tunnel junction portion via the in-plane magnetization film, during information readout, to cause the temperature of the in-plane magnetization film to be equal to or less than the transition temperature.

* * * * *